(12) United States Patent
Chang et al.

(10) Patent No.: US 7,067,887 B2
(45) Date of Patent: Jun. 27, 2006

(54) HIGH VOLTAGE DEVICE AND HIGH VOLTAGE DEVICE FOR ELECTROSTATIC DISCHARGE PROTECTION CIRCUIT

(75) Inventors: Chyh-Yih Chang, Taipei (TW); Li-Jen Hsien, Taichung (TW)

(73) Assignee: Novatek Microelectronics Corp., Hsinchu (TW)

( * ) Notice: Subject to any disclaimer, the term of this patent is extended or adjusted under 35 U.S.C. 154(b) by 0 days.

(21) Appl. No.: 10/711,673

(22) Filed: Sep. 30, 2004

(65) Prior Publication Data

US 2005/0285198 A1  Dec. 29, 2005

(30) Foreign Application Priority Data

Jun. 25, 2004  (TW) .............................. 93118470 A

(51) Int. Cl.
*H01L 23/62* (2006.01)

(52) U.S. Cl. ...................... 257/360; 257/362; 257/361; 257/356; 257/355

(58) Field of Classification Search ................ 257/360, 257/355, 356, 173, 328, 345, 361, 362
See application file for complete search history.

(56) References Cited

U.S. PATENT DOCUMENTS

| | | | |
|---|---|---|---|
| 5,932,914 A | 8/1999 | Horiguchi | 257/355 |
| 6,365,932 B1 | 4/2002 | Kouno et al. | 257/341 |
| 6,365,941 B1 | 4/2002 | Rhee | 257/357 |
| 6,507,080 B1 * | 1/2003 | Jang et al. | 257/409 |
| 6,528,850 B1 * | 3/2003 | Hebert | 257/345 |
| 6,593,621 B1 * | 7/2003 | Tsuchiko et al. | 257/335 |
| 6,624,487 B1 | 9/2003 | Kunz et al. | 257/409 |
| 6,693,339 B1 * | 2/2004 | Khemka et al. | 257/492 |
| 6,879,003 B1 * | 4/2005 | Cheng et al. | 257/355 |
| 6,882,023 B1 * | 4/2005 | Khemka et al. | 257/493 |
| 6,933,560 B1 * | 8/2005 | Lee et al. | 257/328 |

* cited by examiner

*Primary Examiner*—Nathan J. Flynn
*Assistant Examiner*—Victor A. Mandala, Jr.
(74) *Attorney, Agent, or Firm*—Jiang Chyun IP Office

(57) ABSTRACT

A high voltage device for an electrostatic discharge protection circuit is provided. A silicon layer is disposed in a substrate. A first type well and a second type well are disposed in the silicon layer. A lightly doped region of a second type well is located next to the first type well. A heavily doped region of the second type well is located underneath a portion of the first type well and the lightly doped region. A gate structure is disposed over a portion of the first type well and the lightly doped region. A second type first doped region and a second type second doped region are disposed in the lightly doped region and the first type well on each side of the gate structure. An isolation structure is disposed in the lightly doped region. A first type doped region is disposed in the first type well.

18 Claims, 7 Drawing Sheets

HIGH VOLTAGE DEVICE AND HIGH VOLTAGE DEVICE FOR ELECTROSTATIC DISCHARGE PROTECTION CIRCUIT

CROSS-REFERENCE TO RELATED APPLICATION

This application claims the priority benefit of Taiwan application serial no. 93118470, filed Jun. 25, 2004.

BACKGROUND OF THE INVENTION

1. Field of the Invention

The present invention relates to a semiconductor device. More particularly, the present invention relates to a high voltage device and a high voltage device for an electrostatic discharge protection circuit.

2. Description of the Related Art

At a high relative humidity (RH), people walking on a carpeted floor may accumulate sufficient electric charges to produce several hundreds to several thousand volts of static electricity. If the relative humidity is really low, static electricity of up to ten thousand volts may be produced. Furthermore, any machines used for packaging semiconductor devices or testing semiconductor devices may routinely produce several hundreds to several thousand volts of static electricity. When the charged body (for example, human body or machine) is in contact with a silicon wafer, static electricity will discharge through the wafer. The instantaneous power during the electrostatic discharge is capable of damaging the semiconductor devices within the wafer resulting in device failure. The same type of electrostatic discharge also threatens the integrity of any packaged chip.

A number of methods have been developed to protect semiconductor integrated circuit devices against possible damages due to an electrostatic discharge (ESD). The most common type of ESD protection is the incorporation of a special hardware inside the package. In other words, a specially designed electrostatic protection circuit is set up between an internal circuit to be protected and each bonding pad.

In U.S. Pat. No. 6,624,487, Kunz has disclosed a design having two N-type metal-oxide semiconductor (NMOS) transistors 100 and 102 (as shown in FIG. 1). As shown in FIG. 1, the gate of the transistors 100 and 102 are mutually connected. The drains 104a and 104b of these two transistors 100 and 102 are formed within N-type wells 106 and are connected together. Furthermore, one of the transistors (100 or 102) is used to switch on the parasitic bipolar transistor of the other transistor 102.

In another U.S. Pat. No. 6,365,941, Rhee of Samsung Electronics Co. Ltd. has disclosed an electrostatic discharge protection circuit (as shown in FIG. 2). As shown in FIG. 2, the electrostatic discharge protection circuit comprises a MOS transistor 200 and a Zener diode 202. The threshold voltage of the MOS transistor is higher than the operating voltage of the internal circuit but lower than the junction breakdown voltage of the drain of MOS transistors inside the internal circuit. Furthermore, a plurality of bonding pads may use a common diode having a large junction region instead of each bonding pad using a Zener diode.

In another U.S. Pat. No. 5,932,914, Horiguchi of NEC has disclosed an electrostatic breakdown protection device (as shown in FIG. 3). As shown in FIG. 3, the device comprises a protection diode 300, an NPN protection bipolar transistor 302, a P-type well 304, an N-type metal-oxide semiconductor field effect transistor (NMOSFET) 306 and an N-type buried layer 308. According to Horiguchi, during operating protective elements, the N-type buried layer absorbs electrons emitted by the protective elements so that the internal circuit is prevented from possible damage by the injected electrons.

In addition, in U.S. Pat. No. 6,365,932 (as shown in FIG. 4), Kouno et al of Denso also disclosed a power MOS transistor having protective diodes therein such that the power MOS has a larger breakdown differential voltage and a lower sheet resistance. As shown in FIG. 4, the power MOS is an up-drain type MOSFET. The MOSFET has a thicker gate dielectric layer on the drain side. Furthermore, a protective diode for surge bypassing is formed between the P-type doped region 400 and the deep N-type doped region 402.

Due to the demand for high voltage signals in recent years, processes capable of producing complimentary metal-oxide semiconductor (CMOS) transistors for high voltage systems have been developed. These types of transistors are often applied in high voltage power integrated circuits or video interface circuits including, for example, display driver ICs, power supplies, power managements, telecommunications, automobile electronics or industrial controls. To meet the demands of a high voltage system (for example, an operating voltage greater than 10V), the fabrication process of most MOS transistors adopt the following types of designs to increase the breakdown voltage. First, a less heavily doped epitaxial silicon layer is formed over the silicon substrate to rebuild the doping concentration of device region for increasing the breakdown and operating voltage. Second, more doped regions are added to the source or the drain of the MOS transistor so that the junction breakdown voltage is increased and with it the operating voltage. Third, a field oxide layer is disposed between the drain and the gate so that the breakdown voltage between the drain and the gate is increased.

FIG. 5 is a schematic cross-sectional view of a conventional symmetrical NMOS in a high voltage system. As shown in FIG. 5, the high voltage N-type well (HVNW) 500 and 502 are disposed underneath the source/drain N-type heavily doped regions 504 and 506. Furthermore, the N-type heavily doped region 504 and the high voltage N-type well 500 together form the source of the NMOS transistor while the N-type heavily doped region 506 and the high voltage N-type well 502 together form the drain of the NMOS transistor. Because the source and the drain are symmetrically disposed, the source and drain can be interchanged in circuit applications. In addition, the bulk region of the NMOS transistor is basically formed within the P-type well 508. The bulk potential is controlled through the P-type epitaxial silicon layer 510, the P-type substrate 512, the P-type well 514 and the P-type heavily doped region 516. Furthermore, various components of the NMOS transistor are fabricated on the thick P-type epitaxial silicon layer 510 (having a thickness of about 3~20 μm) through conventional CMOS processes including, for example, ion implantation, thermal diffusion, oxidation and photolithography. In fact, the thin P-type epitaxial silicon layer 510 is the remaining portion of the thick epitaxial silicon layer after the CMOS processes. For the NMOS transistor in a high voltage system, the junction between the high voltage N-type well and the P-type well with high breakdown voltage constitutes the source/bulk interface. In addition, a field oxide isolation structure 518 is disposed between the drain and the polysilicon gate 520. Consequently, a high operating voltage can be applied to the drain or the gate of the NMOS transistor.

FIG. 6 is a schematic cross-sectional view of a conventional non-symmetrical NMOS transistor in a high voltage system. Unlike the structure in FIG. 5, a field oxide isolation structure 604 is disposed between the drain 600 and a gate 602 but no field oxide isolation structure 604 is disposed between the source 606 and the gate 602. Also, no the high voltage n type well 608 is disposed under the source 606. Since the source and the drain of the NMOS transistor are non-symmetrically disposed, the source and the drain cannot be used interchangeably in circuit design.

Although the aforementioned description always refers to an NMOS transistor, a PMOS transistor can similarly be built by changing the N-type/P-type doping. In addition, the aforementioned devices have good operating characteristics when applied to a high voltage system. However, these devices have a lower robustness due to a higher high breakdown voltage when applied in electrostatic discharge protection circuit. Moreover, the area needed to accommodate these devices is large.

FIG. 7 is a graph showing the characteristic current versus voltage (I-V) relationship of the symmetrical NMOS transistor in FIG. 5 measured by a transmission line pulsing (TLP) system. In general, the TLP I-V characteristic explains the state of operation of a device undergoing an electrostatic discharge. The I-V characteristic curve shows an increase in current with an increase in voltage starting at point A and reaches a maximum at the terminal point B (device failure). As shown in FIG. 7, the NMOS transistor only has a moderate electrostatic discharge protection capacity. When a pulse current passes through the NMOS transistor, the voltage is also raised so that there is a higher instantaneous power. The instantaneous power can damage the device irreversibly.

SUMMARY OF THE INVENTION

Accordingly, at least one objective of the present invention is to provide a high voltage device for an electrostatic discharge protection circuit that has a higher robustness than a conventional high voltage device.

At least a second objective of the present in invention is to provide a high voltage device that can be used in an ordinary circuit as well as an electrostatic discharge protection circuit.

To achieve these and other advantages and in accordance with the purpose of the invention, as embodied and broadly described herein, the invention provides a high voltage device for an electrostatic discharge protection circuit. The high voltage device comprises a first type substrate, a first type epitaxial silicon layer, a first type well, a second type well, a gate structure, a second type first doped region, a second type second doped region, a first isolation structure and a first type doped region. The first type epitaxial silicon layer is disposed in the first type substrate. The first type well and the second type well are disposed in the first type epitaxial silicon layer. The second type well comprises a second type lightly doped region and a second type heavily doped region. The second type lightly doped region is located next to the first type well and the second type heavily doped region is located underneath a portion of the first type well and the second type lightly doped region. The gate structure is disposed on a portion of the first type well and the second type lightly doped region. The second type first doped region and the second type second doped region are respectively disposed in the second type lightly doped region and the first type well on each side of the gate structure. The first isolation structure is disposed in the second type lightly doped region and between the gate structure and the second type first doped region. The first type doped region is disposed in the first type well and adjacent to the second type second doped region.

The present invention also provides a high voltage device. The high voltage device comprises a first type substrate, a first type epitaxial silicon layer, a first type well, a second type well, a gate structure, a second type first doped region, a second type second doped region, a first isolation structure and a first type doped region. The first type epitaxial silicon layer is disposed in the first type substrate. The first type well and the second type well are disposed in the first type epitaxial silicon layer. The second type well comprises a second type lightly doped region and a second type heavily doped region. The second type lightly doped region is located next to the first type well and the second type heavily doped region is located underneath a portion of the first type well and the second type lightly doped region. The gate structure is disposed on a portion of the first type well and the second type lightly doped region. The second type first doped region and the second type second doped region are respectively disposed in the second type lightly doped region and the first type well on each side of the gate structure. The first isolation structure is disposed in the lightly doped region of the second type well and between the gate structure and the second type first doped region. The first type doped region is disposed in the first type well and adjacent to the second type second doped region.

The second type lightly doped region, the first type well and the second type second doped region inside the high voltage device of the present invention form a parasitic bipolar transistor. Similarly, the second type heavily doped region, the first type well and the second type second doped region together form another parasitic bipolar transistor. Hence, any pulse current entering from the second type first doped region can be channeled away through the second type second doped region after passing through the two parasitic bipolar transistors. In other words, the high voltage device of the present invention can be used inside an electrostatic discharge protection circuit beside an ordinary circuit.

It is to be understood that both the foregoing general description and the following detailed description are exemplary, and are intended to provide further explanation of the invention as claimed.

BRIEF DESCRIPTION OF THE DRAWINGS

The accompanying drawings are included to provide a further understanding of the invention, and are incorporated in and constitute a part of this specification. The drawings illustrate embodiments of the invention and, together with the description, serve to explain the principles of the invention.

DESCRIPTION OF THE PREFERRED EMBODIMENTS

Figure 1:
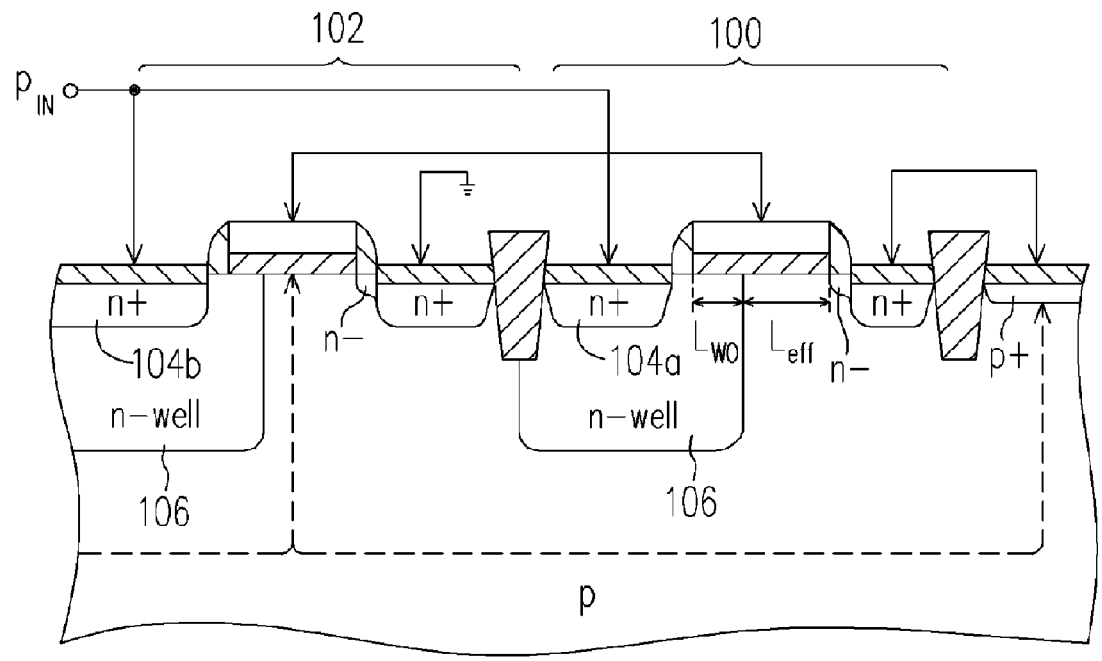
FIG. 1 is a schematic cross-sectional view of a device for an electrostatic discharge protection circuit disclosed in U.S. Pat. No. 6,624,487.
Figure 2:
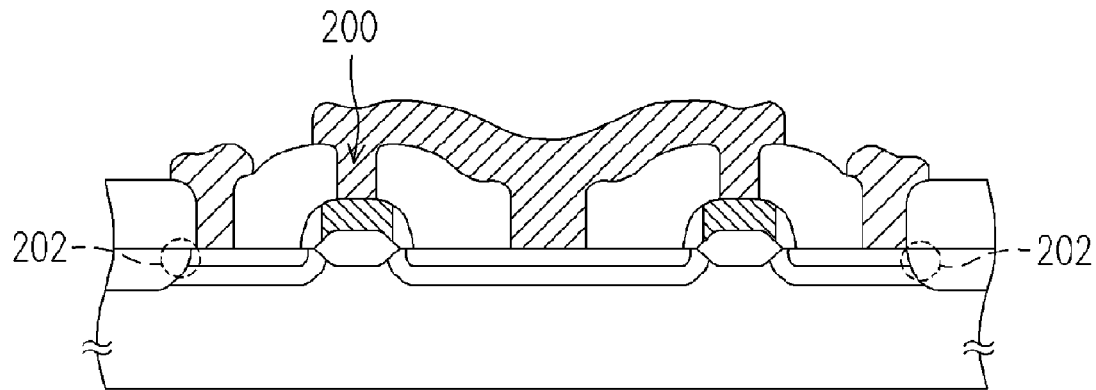
FIG. 2 is a schematic cross-sectional view of a device for an electrostatic discharge protection circuit disclosed in U.S. Pat. No. 6,365,941.
Figure 3:
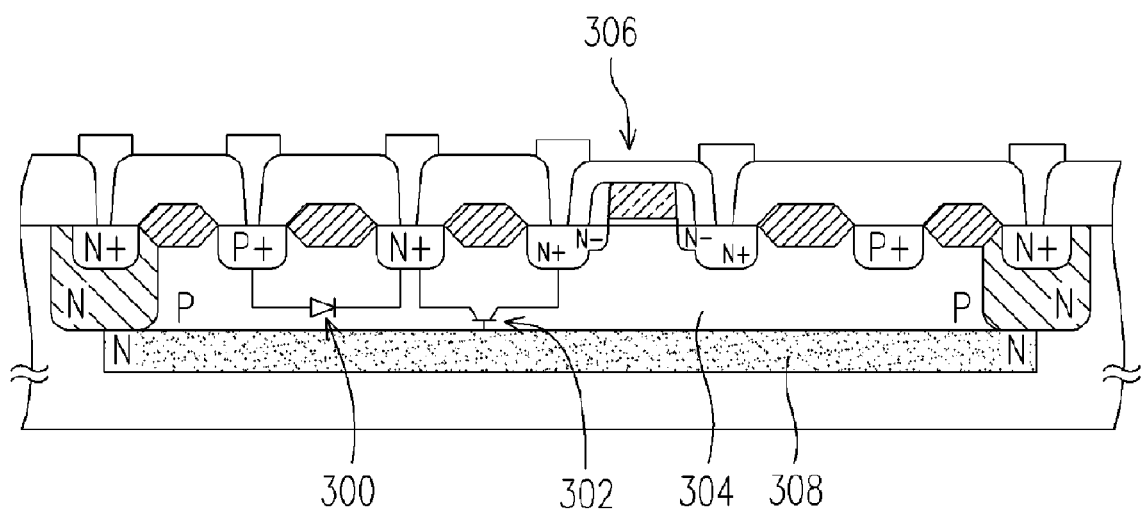
FIG. 3 is a schematic cross-sectional view of a device for an electrostatic discharge protection circuit disclosed in U.S. Pat. No. 5,932,914.
Figure 4:
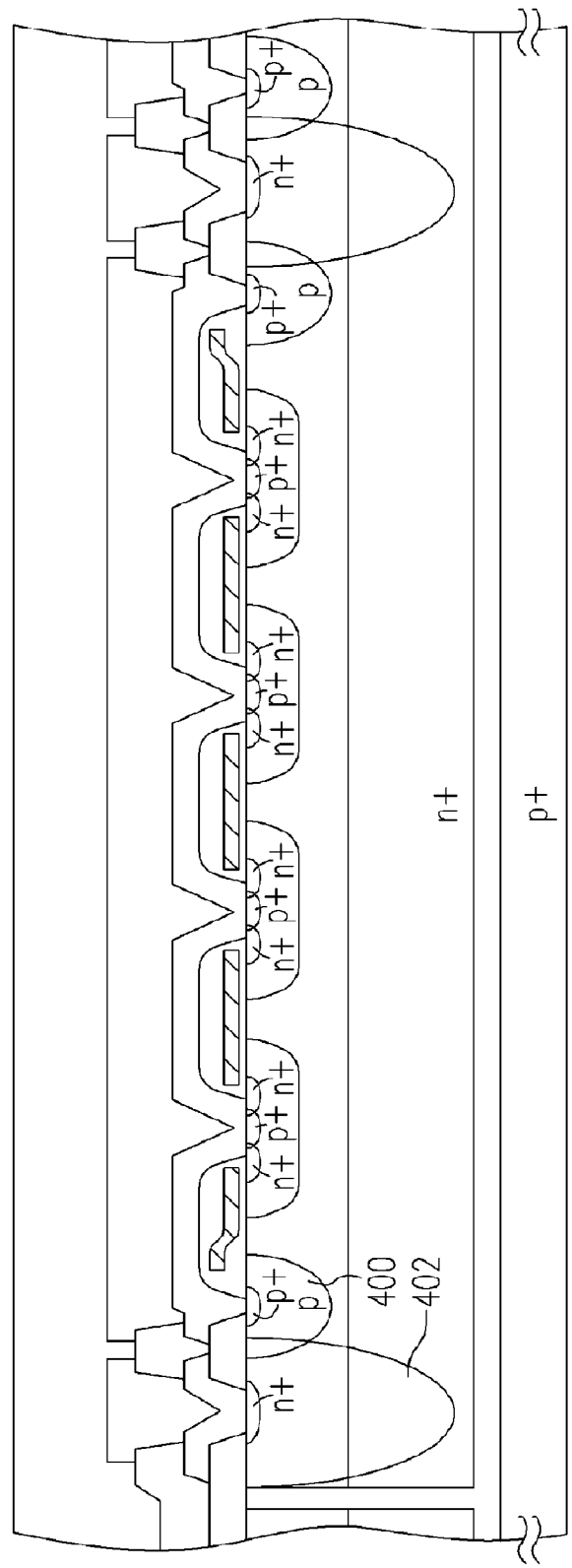
FIG. 4 is a schematic cross-sectional view of a device for an electrostatic discharge protection circuit disclosed in U.S. Pat. No. 6,365,932.
Figure 5:
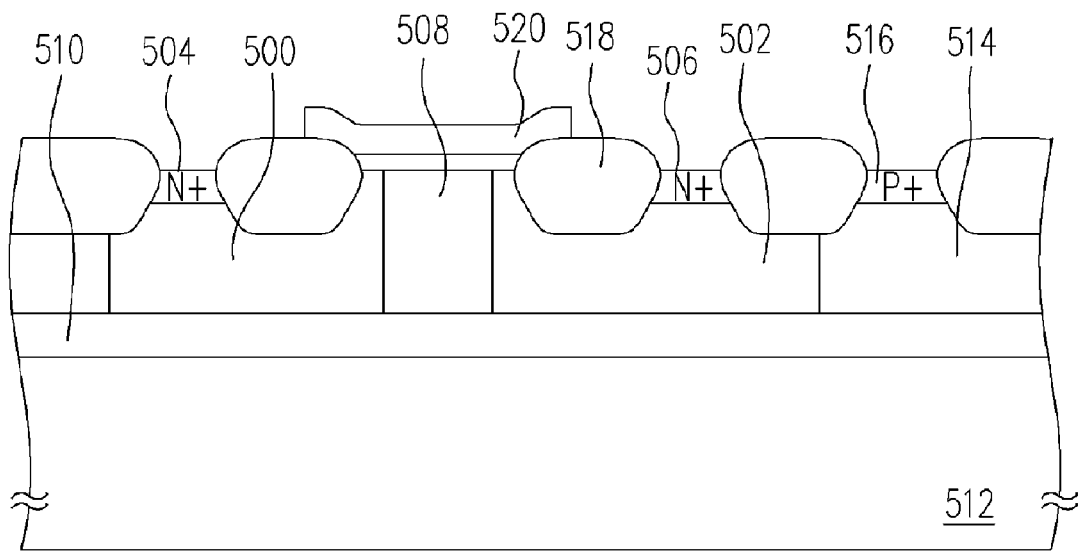
FIG. 5 is a schematic cross-sectional view of a conventional symmetrical NMOS in a high voltage system.
Figure 6:
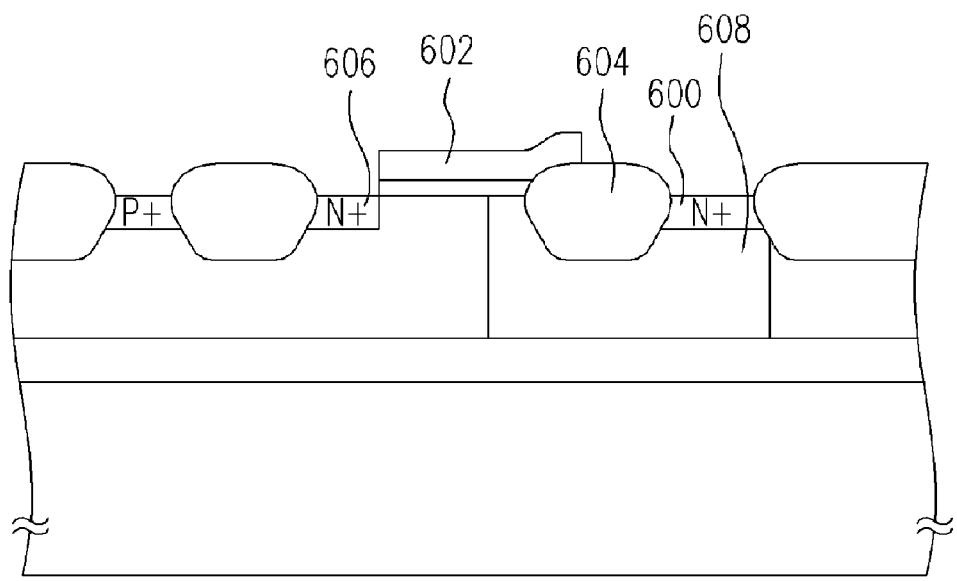
FIG. 6 is a schematic cross-sectional view of a conventional non-symmetrical NMOS transistor in a high voltage system.
Figure 7:
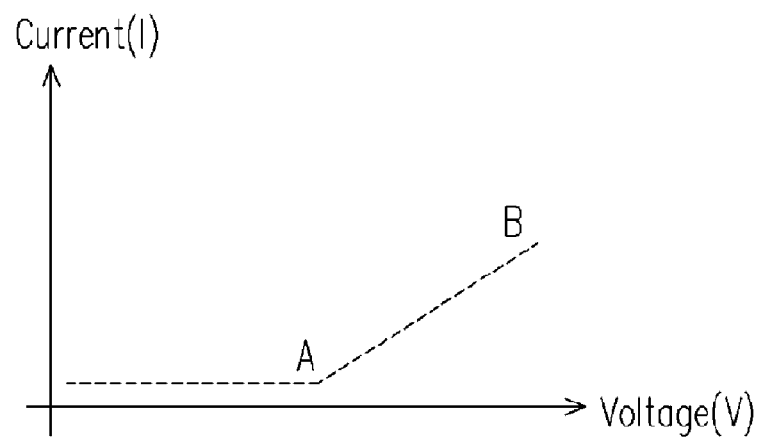
FIG. 7 is a graph showing the characteristic current versus voltage (I-V) relationship of the symmetrical NMOS transistor in FIG. 5 measured by a transmission line pulsing (TLP) system.

Reference will now be made in detail to the present preferred embodiments of the invention, examples of which are illustrated in the accompanying drawings. Wherever possible, the same reference numbers are used in the drawings and the description to refer to the same or like parts.

In the following embodiment, although the high voltage device of the present invention is applied to an electrostatic discharge protection circuit, the application of the present invention is by no means limited as such. The high voltage device can also be applied to ordinary circuits. In addition, according to the high voltage device of the present invention, the first type is a P-type and the second type is an N-type.

Figure 8:
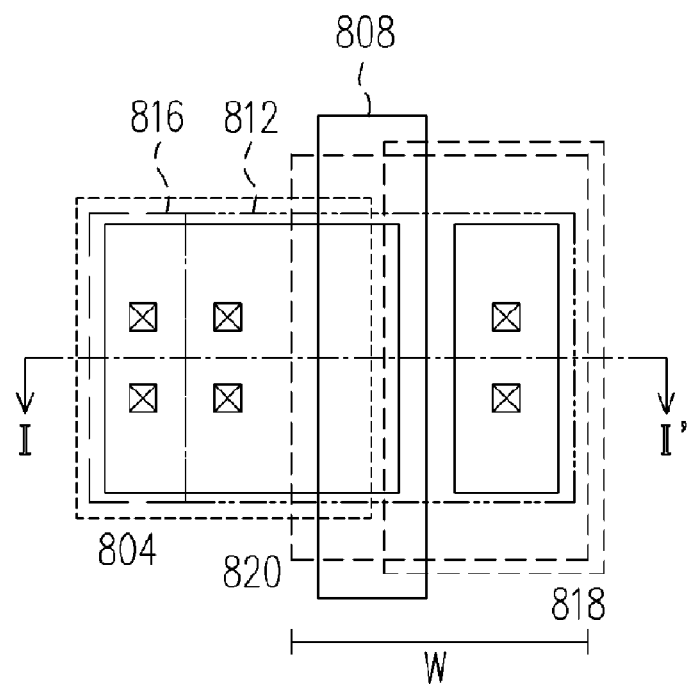
FIG. 8 is a top view of a high voltage device according to one preferred embodiment of the present invention.
Figure 9:
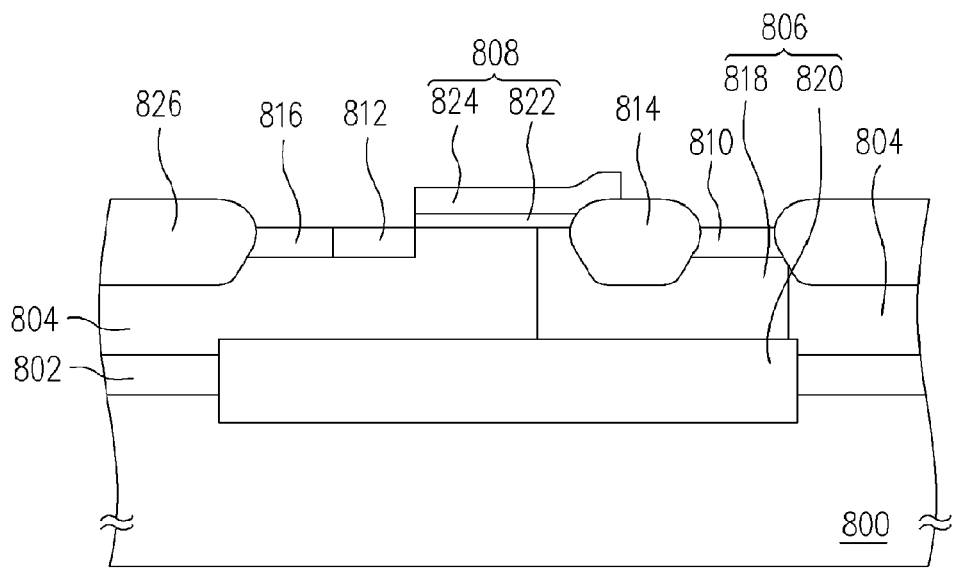
FIG. 9 is a schematic cross-sectional view of along line I–I' of the high voltage device shown in FIG. 8.

FIG. 8 is a top view of a high voltage device according to one preferred embodiment of the present invention. FIG. 9 is a schematic cross-sectional view of along line I–I' of the high voltage device shown in FIG. 8. As shown in FIGS. 8 and 9, the high voltage device of the present invention comprises a P-type substrate 800, a P-type epitaxial silicon layer 802, a P-type well 804, an N-type well 806, a gate structure 808, an N-type doped regions 810, 812, an isolation structure 814, a P-type doped region 816. Furthermore, the N-type well 806 comprises a N-type lightly doped region 818 and an N-type heavily doped region 820 and the gate structure 808 comprises a bottom gate dielectric layer 822 and a top gate 824.

The P-type epitaxial silicon layer 802 is disposed in the P-type substrate 800. The P-type epitaxial silicon layer 802 has a dopant concentration smaller than the P-type substrate 800. The P-type well 804 is disposed in the P-type epitaxial silicon layer 802.

The N-type well 806 is disposed in the P-type epitaxial silicon layer 802. The N-type lightly doped region 818 is next to the P-type well 804. The N-type heavily doped region 820 is disposed underneath a portion of the P-type well 804 and the N-type lightly doped region 818. The N-type lightly doped region 818 is a high voltage N-type well (HVNW) and the N-type heavily doped region 820 is an N-type buried layer (NBL), for example. There is no particular limitation on the width W (as shown in FIG. 8) of the N-type heavily doped region 820. The only criterion is that a portion of the N-type heavily doped region 820 is under the P-type well 804. In general, the smaller the width W of the N-type heavily doped region 820, the device will occupy a smaller surface area and increase surface area utility.

The gate structure 808 is disposed on a portion of the P-type well 804 and the N-type lightly doped region 818. The N-type doped regions 810 and 812 are respectively disposed in the N-type lightly doped region 818 and the P-type well 804 on each side of the gate structure 808. The N-type doped region 810, the N-type lightly doped region 818 and the N-type heavily doped region 820 together serve as a drain while the N-type doped region 812 serves as a source. In other words, the disposition of the source and the drain in the high voltage device is non-symmetrical.

The isolation structure 814 is disposed in the N-type lightly doped region 818 and between the gate structure 808 and the N-type doped region 810 so that the breakdown voltage between the drain and the gate is increased. The isolation structure 814 can be, for example, a field oxide or a shallow trench isolation (STI) according to the line width demanded in the process. In addition, high voltage devices are separated from each other by another isolation structures 826.

The P-type doped region 816 is disposed in the P-type well 804 and adjacent to the N-type doped region 812. Because the P-type doped region 816 and the N-type doped region 812 are disposed next to each other, a circuit can be designed to control the potential at these two regions in a single operation. In addition, the P-type doped region 816 and the P-type well 804 may serve as a bulk region. Since the bulk region and the P-type substrate 800 have identical dopants, they are mutually coupled so that the bulk potential and the substrate potential are identical.

It should be noted that the N-type lightly doped region 818, the P-type well 804 and the N-type doped region 812 of the aforementioned high voltage device form an NPN parasitic bipolar transistor. Similarly, the N-type heavily doped region 820, the P-type well 804 and the N-type doped region 812 of the high voltage device form another NPN parasitic bipolar transistor. Therefore, when a pulse current enters the N-type doped region 810 such that the base-emitter voltage is greater than the threshold voltage of the parasitic bipolar transistor, the emitter-collect channel of the parasitic bipolar transistor will conduct and trigger the two parasitic bipolar transistors. The conductive parasitic bipolar transistors provide an electrostatic discharge and protect the circuit. In other words, the pulse current entering from the N-type doped region 810 is channeled away through the N-type doped region 812 after passing through the two parasitic bipolar transistors. The N-type doped region 812 may further connect with a system voltage VDD or a ground voltage VSS. Furthermore, the breakdown voltage of the PN junction between the N-type heavily doped region 820 and the P-type well 804 is smaller than the breakdown voltage of the PN junction between the N-type lightly doped region 818 and the P-type well 804. Consequently, the lower PN junction breakdown voltage between the N-type heavily doped region 820 and the P-type well 804 is used as the breakdown voltage for electrostatic discharge protection.

Figure 10:
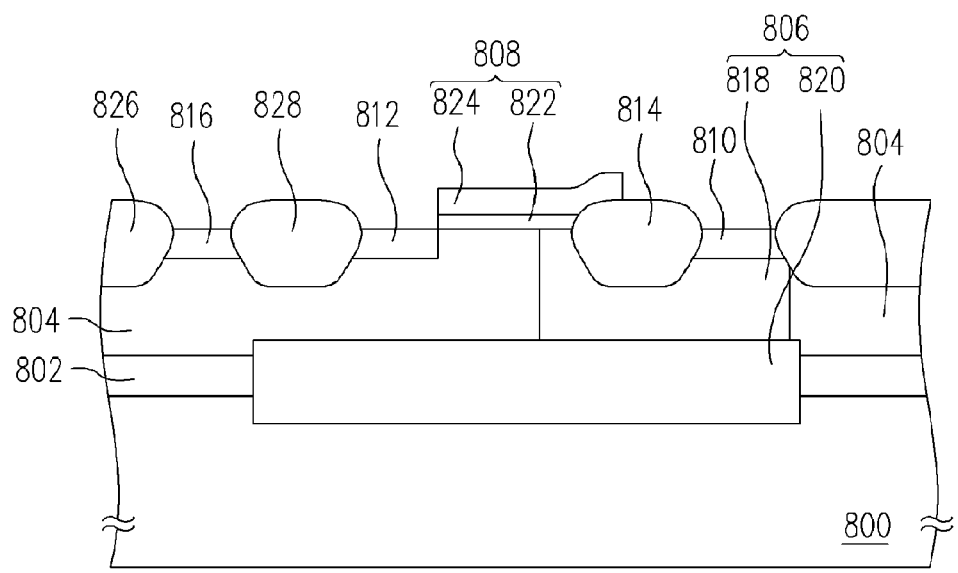
FIG. 10 is a schematic cross-sectional view of a high voltage device according to another preferred embodiment of the present invention.

In another embodiment of the present invention, another isolation structure 828 (as shown in FIG. 10) is disposed between the P-type doped region 816 and the N-type doped region 812. In this case, the P-type doped region 816 in the bulk region and the N-type doped region 812 serving as a source are separated from each other. Hence, the two regions can be utilized in other high voltage devices so that overall area occupied by the device is reduced.

Figure 11:
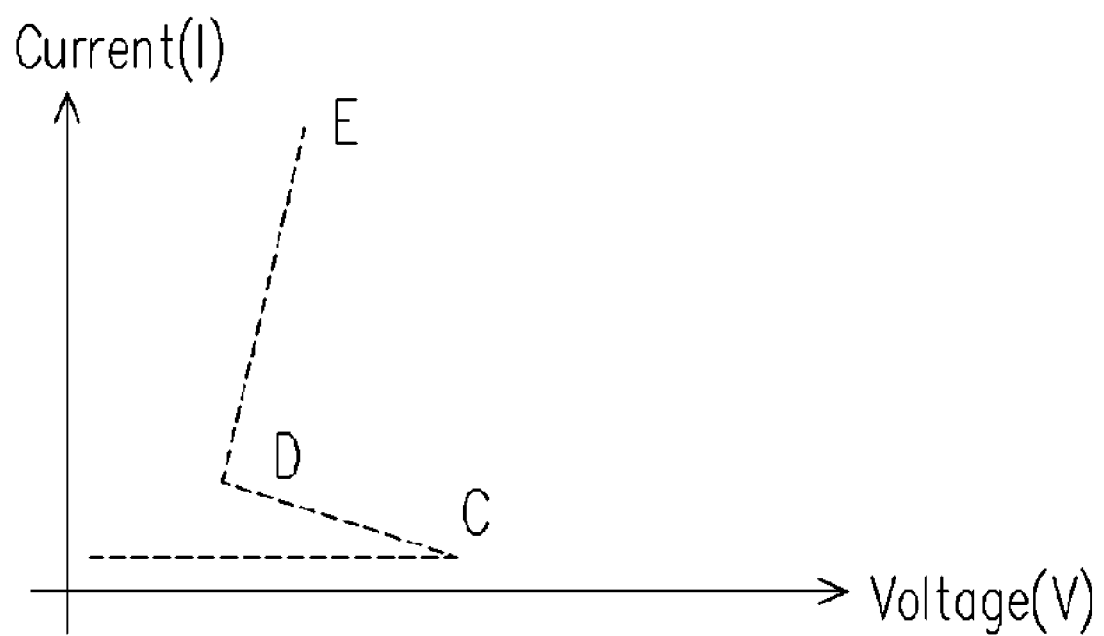
FIG. 11 is a graph showing the characteristic current versus voltage (I-V) relationship of the high voltage device of the present invention measured by a transmission line pulsing (TLP) system.

FIG. 11 is a graph showing the characteristic current versus voltage (I-V) relationship of the high voltage device of the present invention measured by a transmission line pulsing (TLP) system. As shown in FIG. 11, when the pulse current increases, for example, producing a zapping current during an electrostatic discharge, the PN junction between the N-type heavily doped region 820 and the P-type well 804 will breakdown (at point C) due to a lower junction breakdown voltage. However, the parasitic bipolar transistor comprising the N-type lightly doped region 818, the P-type well 804 and the N-type doped region 812 and the parasitic bipolar transistor comprising the N-type heavily doped region 820, the P-type well 804 and the N-type doped region 812 are soon triggered. Thus, the operation returns to the snapback region (D–E) of the I-V curve and fails at point E. Accordingly, a relatively small voltage will appear even if the high voltage device of the present invention is subjected to a large pulse current such as an electrostatic discharge for circuit protection. Hence, the high voltage device of the present invention is substantially more robust than a conventional high voltage device.

In summary, the present invention has at least the following advantages:

1. The I-V characteristic curve of the high voltage device is improved so that a higher pulse current can be withstood. With an increased robustness, the device may be used to protect against an electrostatic discharge protection or serve as an input/output buffer.

2. According to the different circuit requirements, different high voltage devices may use a common area to save area.

3. Aside from electrostatic discharge protection, the high voltage device can be used in the design of high voltage power integrated circuits or video interface circuits including, for example, display driver ICs, power supplies, power administrators, communications, automobile electronics and industrial controls. Furthermore, the device can operate normally when the system voltage is set between 12~50V or higher.

It will be apparent to those skilled in the art that various modifications and variations can be made to the structure of the present invention without departing from the scope or spirit of the invention. In view of the foregoing, it is intended that the present invention cover modifications and variations of this invention provided they fall within the scope of the following claims and their equivalents.

What is claimed is:

1. A high voltage device for an electrostatic discharge protection circuit, comprising:
   a first type substrate;
   a first type epitaxial silicon layer disposed in the first type substrate;
   a first type well disposed in the first type epitaxial silicon layer;
   a second type well disposed in the first type epitaxial silicon layer, wherein the second type well comprises a second type lightly doped region and a second type heavily doped region, the second type lightly doped region is located next to the first type well and the second heavily doped region is located underneath a portion of the first type well and the second type lightly doped region, wherein the first type well adjoins with the second heavily doped region;
   a gate structure disposed on a portion of the first type well and the second type lightly doped region;
   a second type first doped region and a second type second doped region disposed in the second type lightly doped region and the first type well on each side of the gate structure respectively;
   a first isolation structure disposed in the second type lightly doped region and between the gate structure and the second type first doped region;
   a first type doped region disposed in the first type well and adjacent to the second type second doped region; and
   a second isolation structure disposed in the first type well and between the first type doped region and the second type second doped region.

2. The high voltage device of claim 1, wherein the second type lightly doped region, the first type well and the second type second doped region together constitute a parasitic bipolar transistor, and the second type heavily doped region, the first type well and the second type second doped region together constitute another parasitic bipolar transistor so that a pulse current entering from the second type first doped region is able to channel away through the second type second doped region after passing through the two parasitic bipolar transistors.

3. The high voltage device of claim 2, wherein the PN junction between the second type heavily doped region and the first type well has a smaller breakdown voltage than the PN junction between the second type lightly doped region and the first type well, and the breakdown voltage of the PN junction between the second type heavily doped region and the first type well is the breakdown voltage of the electrostatic discharge protection circuit.

4. The high voltage device of claim 1, wherein the first isolation structure comprises a field oxide isolation structure or a shallow trench (STI) structure.

5. The high voltage device of claim 1, wherein the second type first doped region, the second type lightly doped region and the second type heavily doped region together serves as a drain and the second type second doped region serves as a source.

6. The high voltage device of claim 1, wherein the second type lightly doped region comprises a high voltage second type well.

7. The high voltage device of claim 1, wherein the second type heavily doped region comprises a second type buried layer.

8. The high voltage device of claim 1, wherein first type is a P-type and the second type is an N-type.

9. A high voltage device, comprising:
   a first type substrate;
   a first type epitaxial silicon layer disposed in the first type substrate;
   a first type well disposed in the first type epitaxial silicon layer;
   a second type well disposed in the first type epitaxial silicon layer, wherein the second type well comprises a second type lightly doped region and a second type heavily doped region, the second type lightly doped region is located next to the first type well and the second heavily doped region is located underneath a portion of the first type well and the second type lightly doped region, wherein the first type well adjoins with die second heavily doped region;
   a gate structure disposed on a portion of the first type well and the second type lightly doped region;
   a second type first doped region and a second type second doped region disposed in the second type lightly doped region and the first type well on each side of the gate structure respectively;

a first isolation structure disposed in the second type lightly doped region and between the gate structure and the second type first doped region;

a first type doped region disposed in the first type well and adjacent to the second type second doped region; and a second isolation structure disposed in the first type well and between the first type doped region and the second type second doped region.

10. The high voltage device of claim 9, wherein the second isolation structure comprises a field oxide isolation structure or a shallow trench isolation (STI) structure.

11. The high voltage device of claim 9, wherein the first isolation structure comprises a field oxide isolation structure or a shallow trench (STI) structure.

12. The high voltage device of claim 11, wherein the second isolation structure comprises a field oxide isolation structure or a shallow trench isolation (STI) structure.

13. The high voltage device of claim 9, wherein the high voltage device has a variety of applications in the design of circuits.

14. The high voltage device of claim 13, wherein the high voltage device is used inside display driver ICs, power supplies, power administrators, telecommunications, automobile electronics and industrial controls.

15. The high voltage device of claim 9, wherein the second type first doped region, the second type lightly doped region and the second type heavily doped region together serves as a drain and the second type second doped region serves as a source.

16. The high voltage device of claim 9, wherein the second type lightly doped region comprises a high voltage second type well.

17. The high voltage device of claim 9, wherein the second type heavily doped region comprises a second type buried layer.

18. The high voltage device of claim 9, wherein first type is a P-type and the second type is an N-type.

* * * * *